(12) United States Patent
Kwon et al.

(10) Patent No.: US 12,354,899 B2
(45) Date of Patent: Jul. 8, 2025

(54) SEMICONDUCTOR DEVICES AND METHODS OF MANUFACTURING THE SAME

(71) Applicant: SAMSUNG ELECTRONICS CO., LTD., Suwon-si (KR)

(72) Inventors: Taeyong Kwon, Suwon-si (KR); Yoonjoong Kim, Suwon-si (KR); Youngjin Yang, Suwon-si (KR); Dain Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 160 days.

(21) Appl. No.: 18/133,242

(22) Filed: Apr. 11, 2023

(65) Prior Publication Data

US 2023/0402307 A1    Dec. 14, 2023

(30) Foreign Application Priority Data

Jun. 8, 2022  (KR) .................. 10-2022-0069415

(51) Int. Cl.
*H01L 21/68*       (2006.01)
*H01L 21/02*       (2006.01)
(Continued)

(52) U.S. Cl.
CPC ........ *H01L 21/68* (2013.01); *H01L 21/02381* (2013.01); *H01L 21/02576* (2013.01);
(Continued)

(58) Field of Classification Search
CPC .............. H01L 21/68; H01L 21/02381; H01L 21/02576; H01L 21/02579; H01L 21/76816; H01L 21/823487; H01L 21/823807; H01L 21/823892; H01L 23/544; H01L 29/42392; H01L 29/78696; H01L 29/0673; H01L 29/66439; H01L 29/775; H01L 29/66666; H01L 27/092;
(Continued)

(56) References Cited

U.S. PATENT DOCUMENTS 7,427,788 B2    9/2008   Li et al.
9,111,759 B2    8/2015   Yamaguchi
(Continued)

FOREIGN PATENT DOCUMENTS

KR    1999-004178 A    1/1999
KR    10-0652381 B1    12/2006
(Continued)

*Primary Examiner* — Ajay Ojha
*Assistant Examiner* — Sandra Milena Rodriguez Villanu
(74) *Attorney, Agent, or Firm* — Sughrue Mion, PLLC

(57) ABSTRACT

A semiconductor device includes a substrate including a main chip region and a scribe lane region, wherein first trenches are formed in the scribe lane region. A well region doped with impurities is provided on an upper part of the main chip region of the substrate. Align key patterns formed on surfaces of the first trenches and on surfaces of the substrate adjacent to the first trenches in the scribe lane region and having an alternately and repeatedly stacked structure of a silicon germanium pattern and a silicon pattern, are provided. A multi-bridge channel transistor is formed on the main chip region of the substrate.

18 Claims, 19 Drawing Sheets

(51) Int. Cl.
    *H01L 21/768*    (2006.01)
    *H01L 23/544*    (2006.01)
    *H10D 84/01*     (2025.01)
    *H10D 84/03*     (2025.01)

(52) U.S. Cl.
    CPC .. *H01L 21/02579* (2013.01); *H01L 21/76816* (2013.01); *H01L 23/544* (2013.01); *H10D 84/016* (2025.01); *H10D 84/038* (2025.01)

(58) Field of Classification Search
    CPC ........ H01L 27/088; H01L 2223/54426; B82Y 10/00
    See application file for complete search history.

(56) References Cited

U.S. PATENT DOCUMENTS

| | | |
|---|---|---|
| 10,923,432 B2 | 2/2021 | Moser et al. |
| 10,950,487 B2 | 3/2021 | Tutuc et al. |
| 2007/0037359 A1 | 2/2007 | Jo |
| 2023/0050645 A1* | 2/2023 | Chen ................... H01L 23/544 |

FOREIGN PATENT DOCUMENTS

| | | |
|---|---|---|
| KR | 10-0850121 B1 | 8/2008 |
| KR | 10-0859493 B1 | 9/2008 |
| KR | 10-2009-0045714 A | 5/2009 |
| KR | 10-2010-0078947 A | 7/2010 |
| KR | 10-2011-0008463 A | 1/2011 |

\* cited by examiner

FIG. 18
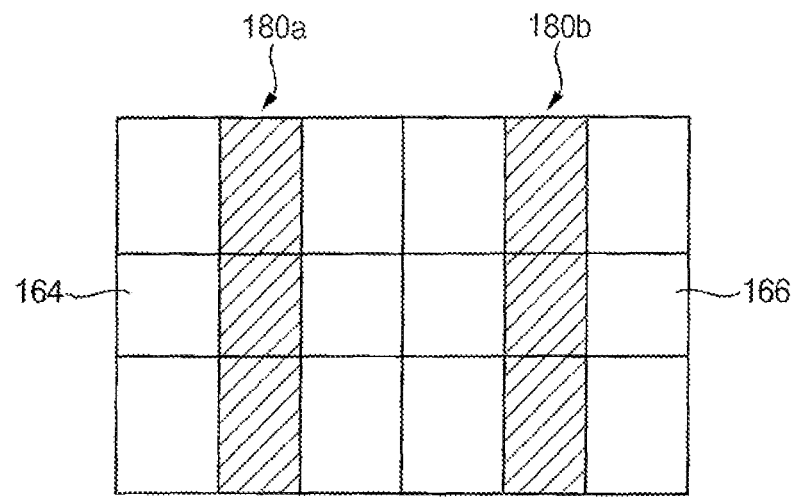
FIG. 19
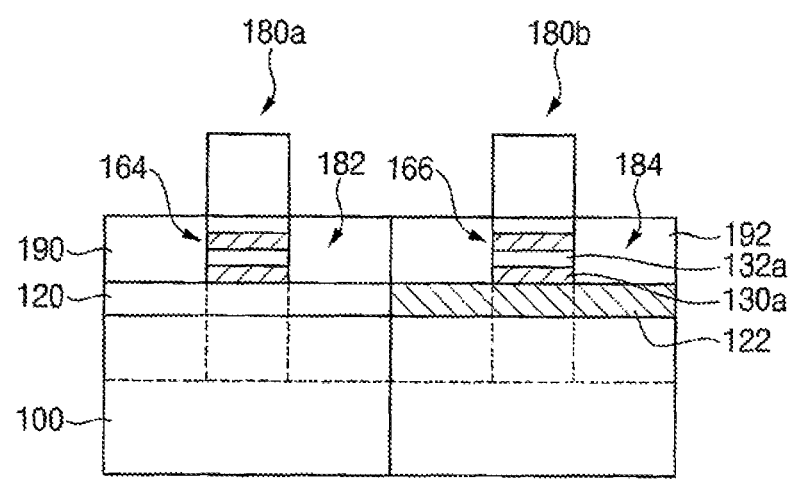
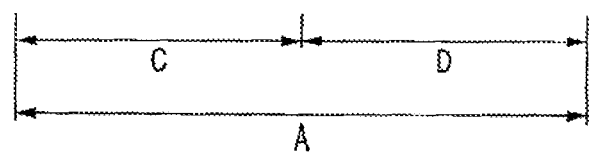

SEMICONDUCTOR DEVICES AND METHODS OF MANUFACTURING THE SAME

CROSS-REFERENCE TO RELATED APPLICATION

This application is based on and claims priority under 35 USC § 119 to Korean Patent Application No. 10-2022-0069415 filed on Jun. 8, 2022 in the Korean Intellectual Property Office, the disclosure of which is incorporated by reference herein in its entirety.

BACKGROUND

1. Field

Example embodiments relate to semiconductor devices and methods of manufacturing the same. More particularly, example embodiments relate to semiconductor devices including an align key pattern.

2. Description of Related Art

Semiconductor devices including multi-bridge channel transistors including vertically stacked multiple channels are being developed. In order to manufacture the multi-bridge channel transistors, an align key pattern may be required on a substrate.

SUMMARY

Example embodiments provide a semiconductor device having an align key pattern and including a multi-bridge channel transistor.

Example embodiments provide a method of manufacturing the semiconductor device.

In accordance with an aspect of the disclosure, a semiconductor device includes a substrate including a main chip region and a scribe lane region, wherein first trenches are formed in the scribe lane region; a well region doped with impurities on an upper part of the main chip region; align key patterns formed on surfaces of the first trenches and on surfaces of the substrate adjacent to the first trenches in the scribe lane region, wherein the align key patterns have an alternately and repeatedly stacked structure of a silicon germanium pattern and a silicon pattern; and a multi-bridge channel transistor on the main chip region.

In accordance with an aspect of the disclosure, a semiconductor device includes a substrate including a main chip region and a scribe lane region, wherein first trenches are formed in the scribe lane region; align key patterns formed on a surface of each of the first trenches and on a surface of the substrate adjacent to each of the first trenches in the scribe lane region, the align key patterns each having an alternately and repeatedly stacked structure of a silicon germanium pattern and a silicon pattern; a P-well region doped with P-type impurities on an upper part of a first region of the substrate in the main chip region; an N-well region doped with N-type impurities on an upper part of a second region of the substrate in the main chip region; an N-type multi-bridge channel transistor formed on the P-well region and comprising a first channel of a first stacked structure of the silicon patterns which are separated from each other in a vertical direction; and a P-type multi-bridge channel transistor formed on the N-well region and comprising a second channel of a second stacked structure of the silicon patterns which are separated from each other in the vertical direction.

In accordance with an aspect of the disclosure, a method of manufacturing a semiconductor device includes forming first trenches in a scribe lane region of a substrate; forming an ion implantation mask on the substrate using the first trenches as an align key; doping impurities into the substrate to form a well region on an upper part of a main chip region of the substrate; alternately and repeatedly stacking a silicon germanium layer and a silicon layer on the main chip region of the substrate and the scribe lane region of the substrate; and patterning the silicon germanium layer and the silicon layer to form a stacked structure of a silicon germanium pattern and a silicon pattern on the main chip region of the substrate and to form an align key pattern including the stacked structure of the silicon germanium pattern and the silicon pattern on the scribe lane region of the substrate.

The semiconductor device according to example embodiments may be provided with align key patterns with a repeatedly stacked structure of a silicon germanium pattern and a silicon pattern along the surface profile of a first trench. In addition, a well region may be formed in the substrate of a main chip region, and a multi-bridge channel transistor may be formed on the substrate of the well region. The multi-bridge channel transistor may have target electrical properties.

BRIEF DESCRIPTION OF DRAWINGS

The above and other aspects, features, and advantages of certain embodiments of the disclosure will be more apparent from the following description taken in conjunction with the accompanying drawings, in which:

FIG. 6 to FIG. 21 are cross-sectional views and plan views for explaining a method of manufacturing a semiconductor device in accordance with example embodiments.

FIGS. 1 to 21 represent non-limiting, example embodiments as described herein.

DETAILED DESCRIPTION OF EMBODIMENTS

Hereinafter, preferred example embodiments will be described in detail with reference to the accompanying drawings.

Hereinafter, a direction parallel to the surface of a substrate will be referred to as a first direction, and a direction parallel to the surface of the substrate and perpendicular to the first direction will be referred to as a second direction. In addition, a direction vertical to the surface of the substrate will be referred to as a vertical direction.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
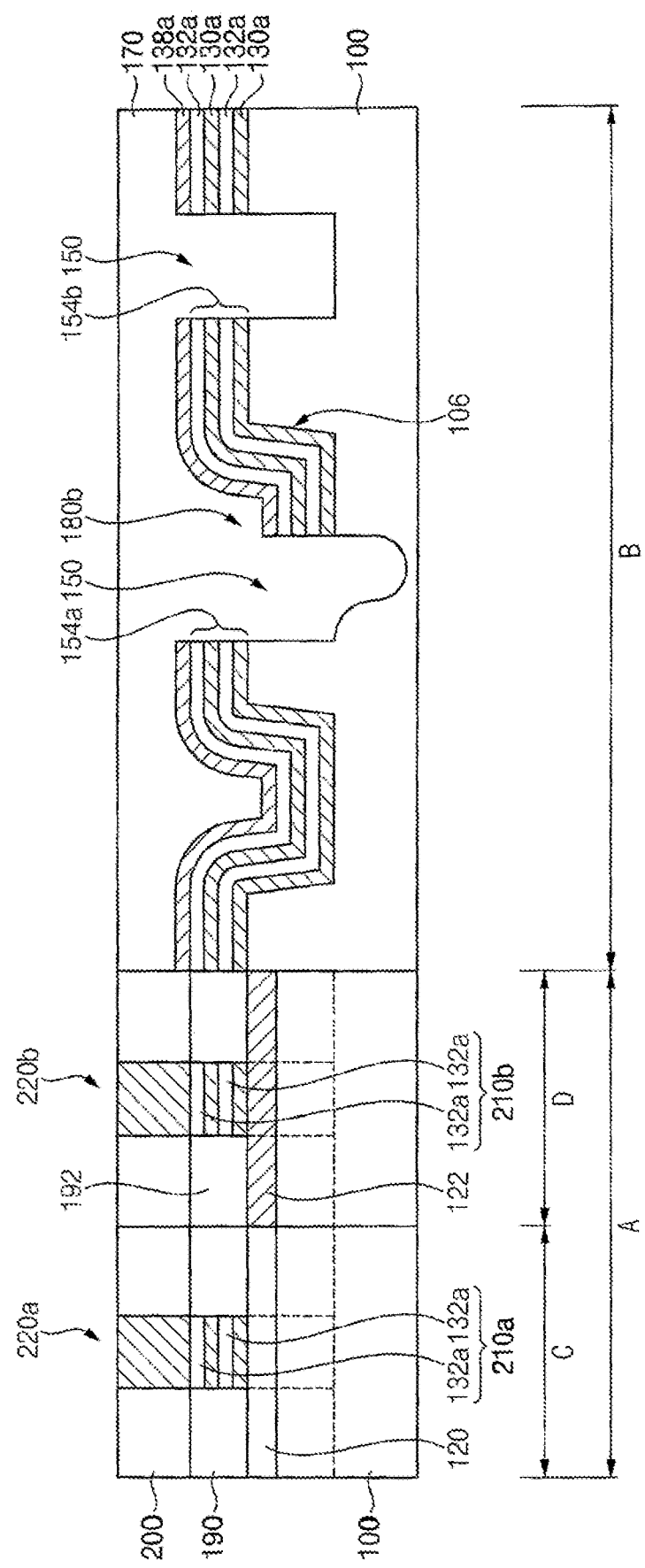
FIG. 1 and FIG. 2 are a cross-sectional view and a plan view for explaining a semiconductor device in accordance with example embodiments.
Figure 2:
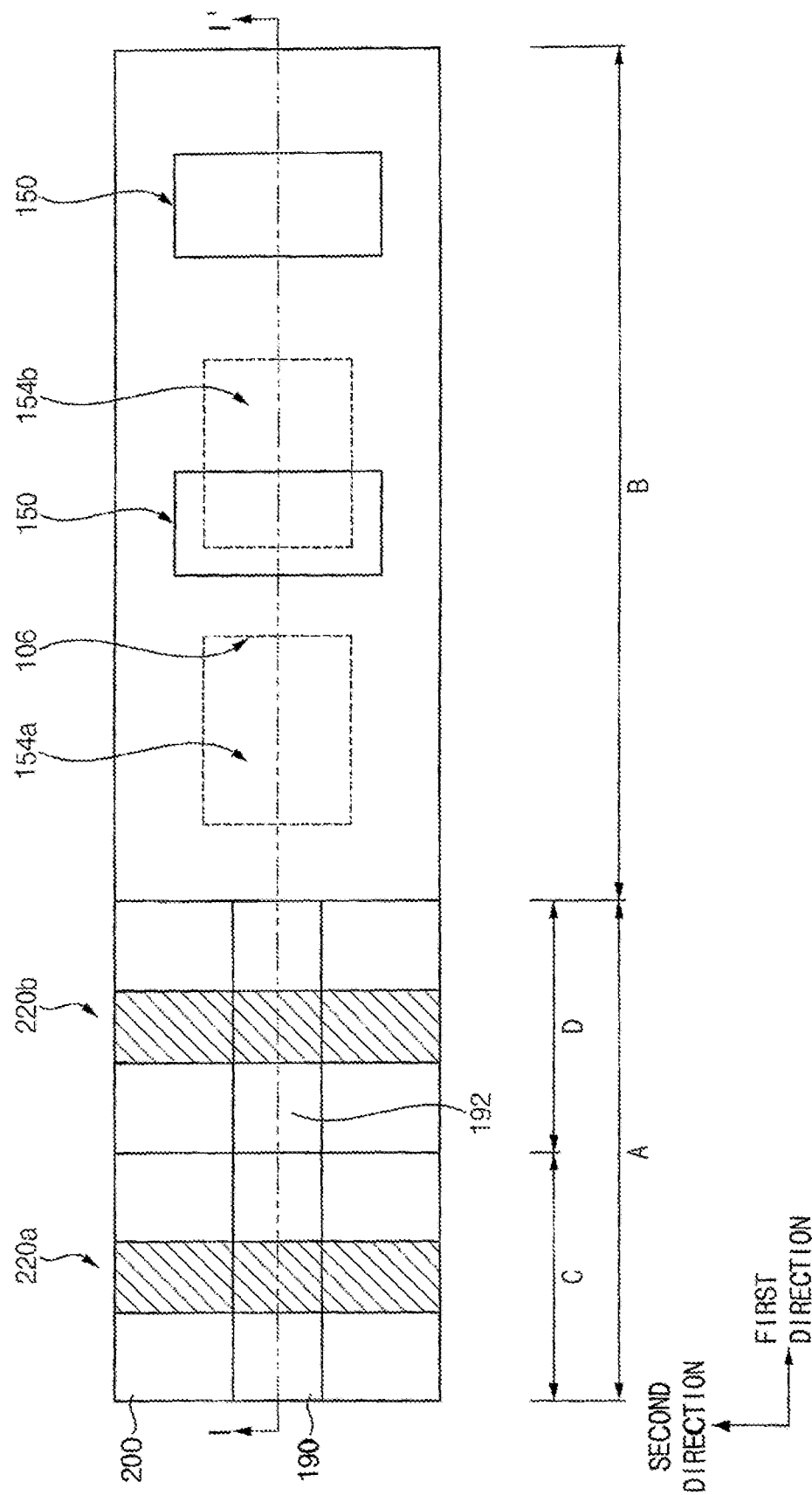
Figure 3:
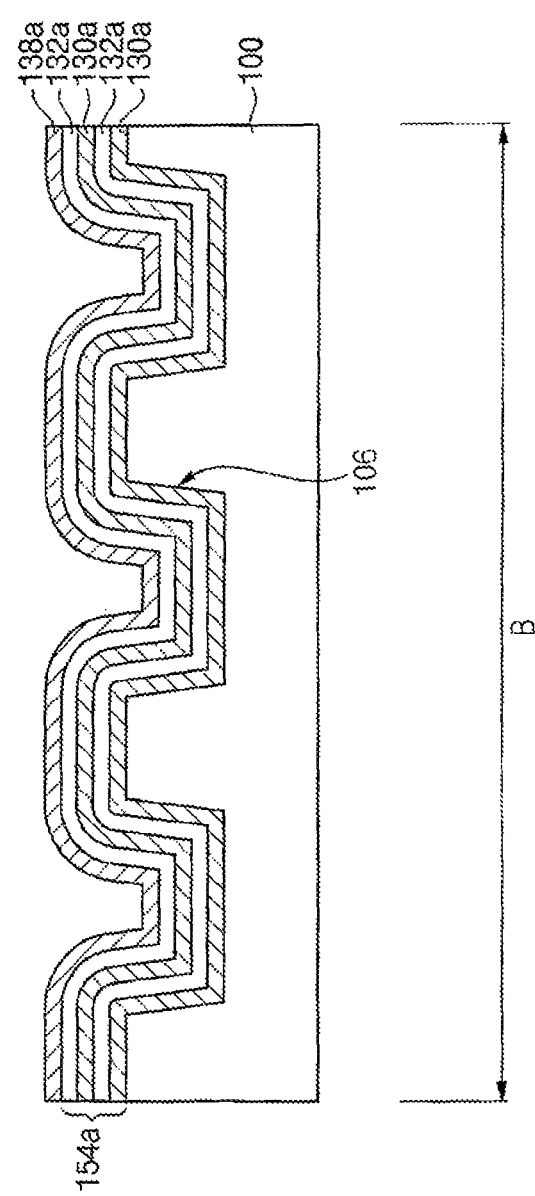
FIG. 3 to FIG. 5 are cross-sectional views showing a portion of a semiconductor device in accordance with example embodiments.
Figure 4:
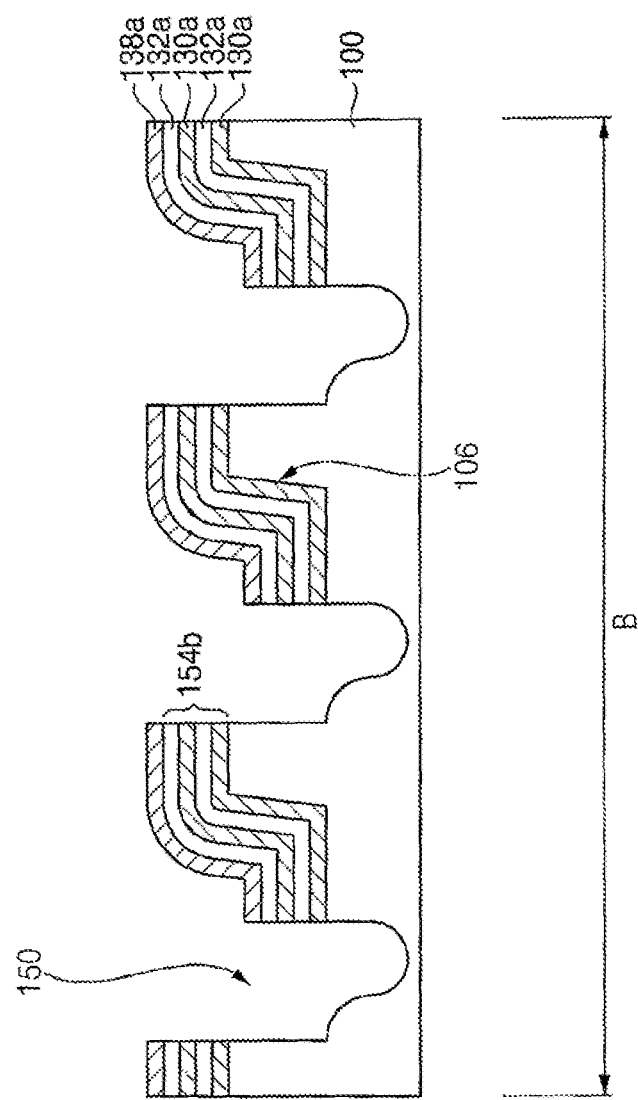
Figure 5:
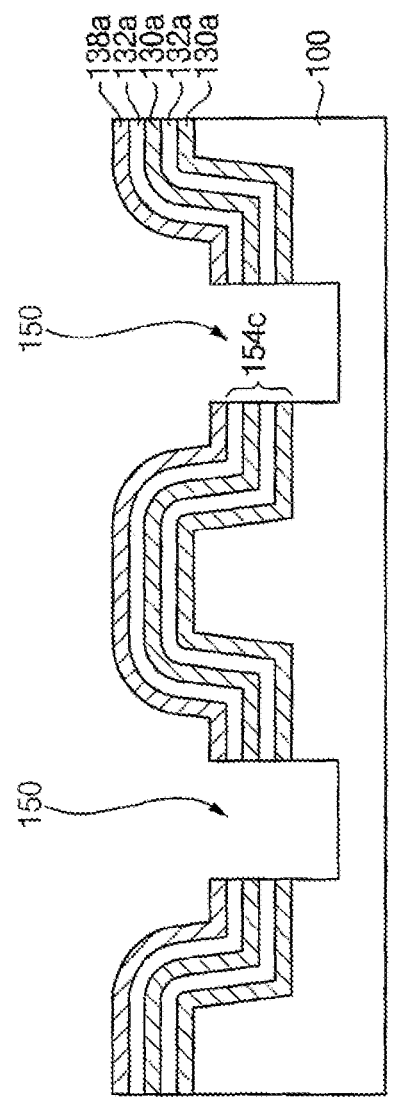

FIG. 1 and FIG. 2 are a cross-sectional view and a plan view for explaining a semiconductor device in accordance with example embodiments. FIG. 3 to FIG. 5 are cross-sectional views showing a portion of a semiconductor device in accordance with example embodiments.

Particularly, FIG. 1 is a cross-sectional view cut along line I-I' in FIG. 2. FIG. 3 to FIG. 5 show embodiments of align key patterns formed in a scribe lane region.

Referring to FIG. 1 to FIG. 5, a substrate 100 including a main chip region A and a scribe lane region B is provided. The main chip region A may include an N-type multi-bridge channel transistor region C and a P-type multi-bridge channel transistor region D. The substrate 100 may be a single crystal silicon substrate.

In the scribe lane region B of the substrate 100, first trenches 106 may be formed. A reticle may be aligned during an exposing process using a height difference (i.e., step difference) between the top surface of the substrate 100 and the bottom surface of each first trench 106.

In example embodiments, the first trenches 106 may be regularly disposed while being separated from each other. In example embodiments, the first trenches 106 may be used as an align key in a process of forming an ion implantation mask for forming a well region in the main chip region A.

In example embodiments, each of the first trenches 106 may have a depth of about 20 nm or more from the top surface of the substrate 100. That is, a distance from the lowermost bottom of each first trench 106 to the top surface of the substrate 100 may be about 20 nm or more. If the depth of the first trench 106 is less than about 20 nm, it may be difficult to distinguish the step difference between the top surface of the substrate 100 and the first trench 106, and the first trench 106 may be difficult to use as an align key. Preferably, the depth from each of the first trench 106 to the top surface of the substrate 100 may be about 30 nm or more.

In example embodiments, the width of the first trench 106 may be greater than the depth of the first trench 106. However, the width of the first trench 106 is not limited thereto. The distance between the first trenches 106 may be not limited. In addition, the side wall of the first trench 106 may have an oblique slope or a vertical slope.

In the scribe lane region B, align key patterns 154a, 154b and 154c may be provided on the inner surfaces of the first trenches 106 and on the top surface of the substrate 100 adjacent to the first trenches 106. The align key patterns 154a, 154b and 154c may include an alternately and repeatedly stacked structure of a silicon germanium pattern 130a and a silicon pattern 132a. The silicon germanium pattern 130a and the silicon pattern 132a may be stacked at least twice in the vertical direction.

At each position in the scribe lane region B, the align key pattern may have various shapes.

As shown in FIG. 3, in a partial region in the scribe lane region B, a first align key pattern 154a may be formed. The first align key pattern 154a may have a repeatedly and alternately stacked shape of a silicon germanium pattern 130a and a silicon pattern 132a along the surface of the first trenches 106 and the top surface of the substrate 100 between adjacent ones of the first trenches 106. The first align key pattern 154a may be continuously formed without cutting of the stacked structure of the silicon germanium pattern 130a and the silicon pattern 132a on the surface of the first trenches 106 and on the top surface of the substrate 100 between the first trenches 106. Since the silicon germanium pattern 130a and the silicon pattern 132a are formed along the surface profile of the first trench 106, the top surface of the first align key pattern 154a may be uneven and have a step difference. In other words, there may be a difference between a height of a top surface of the align key pattern 154a at one position on the substrate and a height of the top surface of the align key pattern 154a at another position on the substrate at shown, e.g., in FIG. 3.

FIG. 4 shows a second align key pattern 154b formed in a partial region in the scribe lane region B.

The second align key pattern 154b may have a partially cut shape of the stacked structure of a silicon germanium layer 130a and a silicon layer 132a formed on the surface of the first trenches 106 and on the top surface of the substrate 100 between adjacent ones of the first trenches 106. The partially cut portion of the stacked structure of the silicon germanium layer 130a and the silicon layer 132a may be referred to as a second trench 150. Accordingly, multiple second align key patterns 154b may be disposed while being separated from each other by second trenches 150. Depending on the position of the second trench 150, the shape of the second align key pattern 154b may be changed.

Referring to FIG. 4, the second trench 150 may be disposed at a position overlapped with a portion of a corresponding first trench 106 and with a portion of the substrate 100 adjacent to the first trench 106. In this case, the second align key pattern 154b may have an alternately and repeatedly stacked shape of the silicon germanium pattern 130a and the silicon pattern 132a along a partial bottom surface and one side wall of the first trench 106 and the top surface of the substrate 100 adjacent to the one side wall of the first trench 106. The top surface of the second align key pattern 154b may be uneven and may have a step difference. In other words, a first portion of the top surface of the second align key pattern 154b may be higher than a second portion of the top surface of the second align key pattern 154b. The bottom surface of the second trench 150 may be uneven and may have a step difference. The second trench 150 may include a first portion overlapped with a portion of the first trench 106 and a second portion overlapped with a portion of the substrate 100 adjacent to the first trench 106 that does not include the first trench 106. The first portion may have a greater depth than the second portion. The bottom surface of the first portion of the second trench 150 may be lower than the bottom surface of the second portion of the second trench 150.

FIG. 5 shows a third align key pattern 154c formed in a partial region in the scribe lane region B.

The third align key pattern 154c may be a partially cut stacked structure of the silicon germanium layer and the silicon layer formed on the surface of the first trenches 106 and on the top surface of the substrate 100 between the first trenches 106. Accordingly, a second trench 150 may be disposed between adjacent ones of multiple third align key patterns 154c.

Referring to FIG. 5, the second trench 150 may be disposed at a position overlapped with a portion of the first trench 106. In this case, the third align key pattern 154c may have an alternately and repeatedly stacked shape of the silicon germanium pattern 130a and the silicon pattern 132a along a partial surface of the first trenches 106 and the top surface of the substrate 100 between the first trenches 106. The top surface of the third align key pattern 154c may be uneven and may have a step difference. In other words, a first portion of the top surface of the third align key pattern 154c may be higher than a second portion of the top surface of the third align key pattern 154c. The bottom surface of the second trench 150 may be lower than the bottom surface of the first trench 106. The second trench 150 may have a greater depth than that of the first trench 106.

A second hard mask pattern 138a covering the top surface of each of the align key patterns 154a, 154b and 154c may be provided. The second hard mask pattern 138a may be not formed on the side walls of the align key patterns 154a, 154b and 154c. The second hard mask pattern 138a may include, for example, a nitride such as silicon nitride.

In the main chip region A, an N-type multi-bridge channel transistor may be formed in an N-type multi-bridge channel transistor region C, and a P-type multi-bridge channel transistor may be formed in a P-type multi-bridge channel transistor region D.

On the substrate 100 of the N-type multi-bridge channel transistor region C, a P-well region 120 doped with P-type impurities in low concentration may be provided.

In the substrate 100 of the N-type multi-bridge channel transistor region C, a first active structure may be provided. The first active structure may include a single crystal semiconductor material. A portion of the substrate 100 adjacent to both sides of the first active structure may be etched to form a first active pattern at the lower part of the first active structure. A device isolation pattern covering both side walls of the first active pattern may be provided.

The first active structure may include a first channel structure 210a (e.g., a first channel of a first stacked structure) and first impurity region structures 190 contacting both side walls of the first channel structure 210a.

The first channel structure 210a may have a stacked structure of silicon patterns 132a which are separated from each other in a vertical direction. Between the silicon patterns 132a in the vertical direction, a gap may be formed. When viewed in a cross section, the first impurity region structures 190 may contact the side walls of the silicon patterns 132a disposed in the vertical direction of the first channel structure 210a.

In example embodiments, the first impurity region structure 190 may include single crystal silicon. In the first impurity region structure 190, N-type impurities may be doped. The first impurity region structure 190 may be provided as the first source/drain regions of the N-type multi-bridge channel transistor.

A first gate structure 220a surrounding the first channel structure 210a and extending in the second direction may be provided. The first gate structure 220a may be provided as the gate of the N-type multi-bridge channel transistor. The first gate structure 220a may include a first gate insulation pattern, a first gate electrode and a capping pattern. The first gate structure 220a may be formed to cover the surface of the first channel structure 210a while filling the inside of the gaps included in the first channel structure 210a as shown, e.g., in FIG. 1.

In example embodiments, a spacer may be further provided at the upper side wall of the first gate structure 220a.

On the substrate 100 of the P-type multi-bridge channel transistor region C, an N-well region 122 doped with N-type impurities in low concentration may be provided.

On the substrate 100 of the P-type multi-bridge channel transistor region D, a second active structure may be provided. The second active structure may include a single crystal semiconductor material. A portion of the substrate 100 adjacent to both sides of the second active structure may be etched to form a second active pattern under the second active structure. A device isolation pattern covering both side walls of the second active pattern may be provided.

The second active structure may include a second channel structure 210b (e.g., a second channel of a second stacked structure) and second impurity region structures 192 contacting both side walls of the second channel structure 210b.

The second channel structure 210b may have a stacked structure of silicon patterns 132a which are separated from each other in a vertical direction. Between the silicon patterns 132a in the vertical direction, a gap may be formed. When viewed in a cross section, the second impurity region structures 192 may contact the side walls of the silicon patterns 132a disposed in the vertical direction of the second channel structure 210b as shown, e.g., in FIG. 1.

In example embodiments, the second impurity region structure 192 may include silicon germanium. In the second impurity region structure 192, P-type impurities may be doped. The second impurity region structure 192 may be provided as the second source/drain regions of the P-type multi-bridge channel transistor.

A second gate structure 220b surrounding the second channel structure 210b and extending in the second direction may be provided. The second gate structure 220b may be provided as the gate of the P-type multi-bridge channel transistor. The second gate structure 220b may include a second gate insulation pattern, a second gate electrode and a capping pattern. The second gate structure 220b may be formed to cover the surface of the second channel structure 210b while filling the inside of the gaps included in the second channel structure 210b.

In example embodiments, a spacer may be further provided on the upper side wall of the second gate structure 220b. In example embodiments, in the gap of the second channel structure 210b, an inner spacer formed on both side walls of the second gate structure 220b may be further provided.

On the first and second impurity region structures 190 and 192 and the device isolation pattern, an insulating interlayer 200 may be formed. The insulating interlayer 200 may cover the side walls of the first and second gate structures 220a and 220b.

As explained above, in the substrate 100 of the scribe lane region B, first trenches 106 may be provided. On the surface of the first trench 106 and on the top surface of the substrate adjacent to the first trench 106, align key patterns 154a, 154b and 154c with a repeatedly stacked structure of a silicon germanium pattern 130a and a silicon pattern 132a may be provided. By using the first trench 106 as an align key, an ion implantation process for forming a P-well region 120 and an N-well region 122 in the substrate 100 of the main chip region may be performed before forming a silicon germanium layer 130 and a silicon layer 132. In addition, a first channel structure 210a and a second channel structure 210b, having target structures may be formed. Accordingly, an N-type multi-bridge channel transistor and a P-type multi-bridge channel transistor may have target electrical properties.

FIG. 6 to FIG. 21 are cross-sectional views and plan views for explaining a method of manufacturing a semiconductor device in accordance with example embodiments.

Particularly, FIGS. 6 to 10, 13, 15, 17, and 19 to 21 are cross-sectional views cutting a semiconductor device in the first direction. FIGS. 11, 14 and 16 are cross-sectional views showing only a main cell region, and are cross-sectional views cutting in the second direction. FIGS. 12 and 18 are plan views, and FIG. 18 shows only a main cell region.

Figure 6:
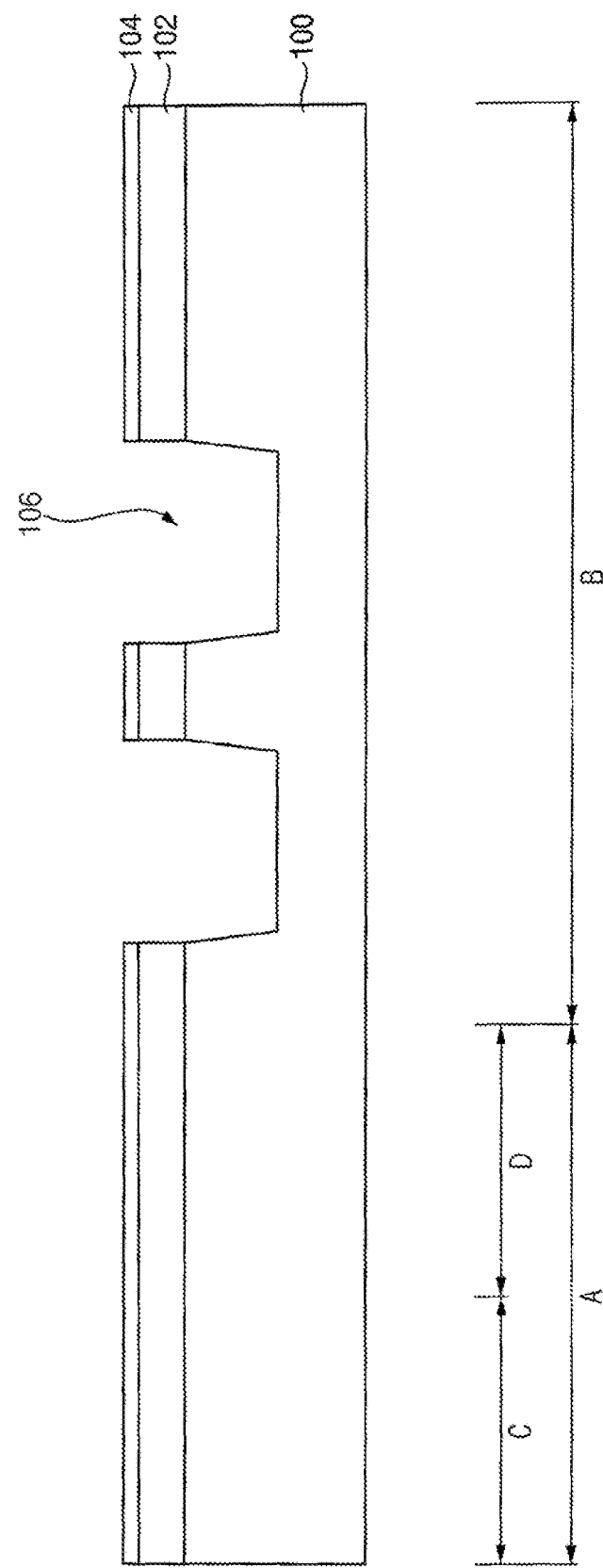

Referring to FIG. 6, a substrate 100 including a main chip region A and a scribe lane region B may be provided. The main chip region A may include an N-type multi-bridge channel transistor region C and a P-type multi-bridge channel transistor region D. The substrate 100 may be a single crystal silicon substrate. On the scribe lane region B of the substrate 100, first trenches 106 to be used as a first align key may be formed.

Particularly, on the substrate 100, a first hard mask layer 102 may be formed. The first hard mask layer 102 may include a spin-on hard mask (SOH) or silicon oxynitride. On the first hard mask layer 102, a first photoresist layer may be coated. With respect to the first photoresist layer, exposing and developing processes may be performed to form a first photoresist pattern 104 covering the entire main chip region A and exposing a portion of the scribe lane region B.

The first hard mask layer 102 and the substrate 100 may be etched using the first photoresist pattern 104 as an etching mask to form first trenches 106. By using the height difference (i.e., step difference) between the top surface of the substrate 100 and the bottom surface of the first trench 106, a reticle may be aligned in the subsequent exposing process.

Each of the first trenches 106 may have a depth of about 20 nm or more from the top surface of the substrate 100. If the depth of the first trench 106 is smaller than about nm, the distinction according to the step difference between the top surface of the substrate 100 and the bottom surface of the first trench 106 may be difficult, and the use of the first trenches 106 as a first align key for aligning a reticle during the subsequent exposing process may become difficult.

After that, the first photoresist pattern 104 may be removed. In addition, the first hard mask layer 102 may be removed.

Figure 7:
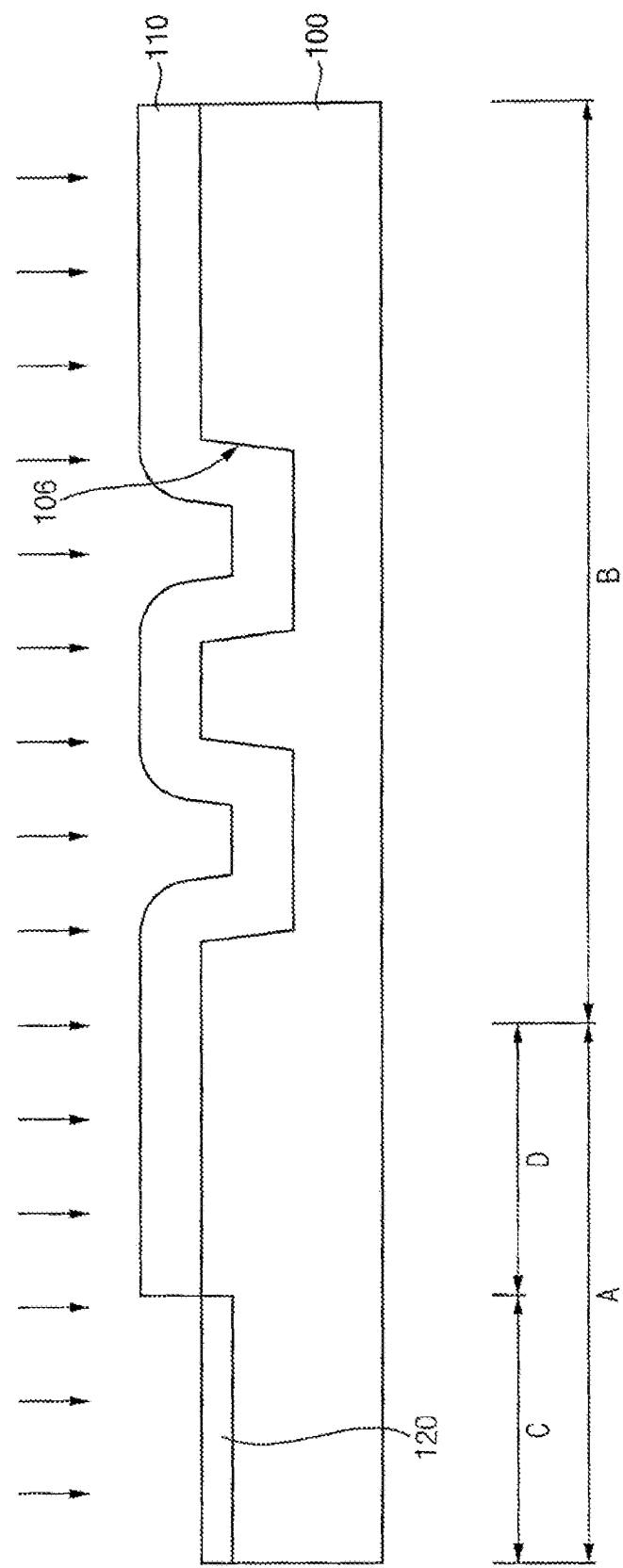

Referring to FIG. 7, a second photoresist layer may be coated on the substrate 100. With respect to the second photoresist layer, exposing and developing processes may be performed to form a second photoresist pattern 110 exposing the N-type multi-bridge channel transistor region C of the main chip region A. The P-type multi-bridge channel transistor region D of the main chip region A and the scribe lane region B may be covered by the second photoresist pattern 110.

In the exposing process for forming the second photoresist pattern 110, a reticle may be aligned using the step difference between the bottom surface of the first trench 106 and the top surface of the substrate 100. Accordingly, a second photoresist pattern 110 may be formed at a target position.

Then, by using the second photoresist pattern 110 as an ion implantation mask, P-type impurities may be doped into the substrate. The P-type impurities may be doped in low concentration. Accordingly, a P-well region 120 may be formed on the upper part of the substrate 100 of the N-type multi-bridge channel transistor region C. In example embodiments, after injecting the P-type impurities, a heat treatment process for activating the P-type impurities may be further performed.

Figure 8:
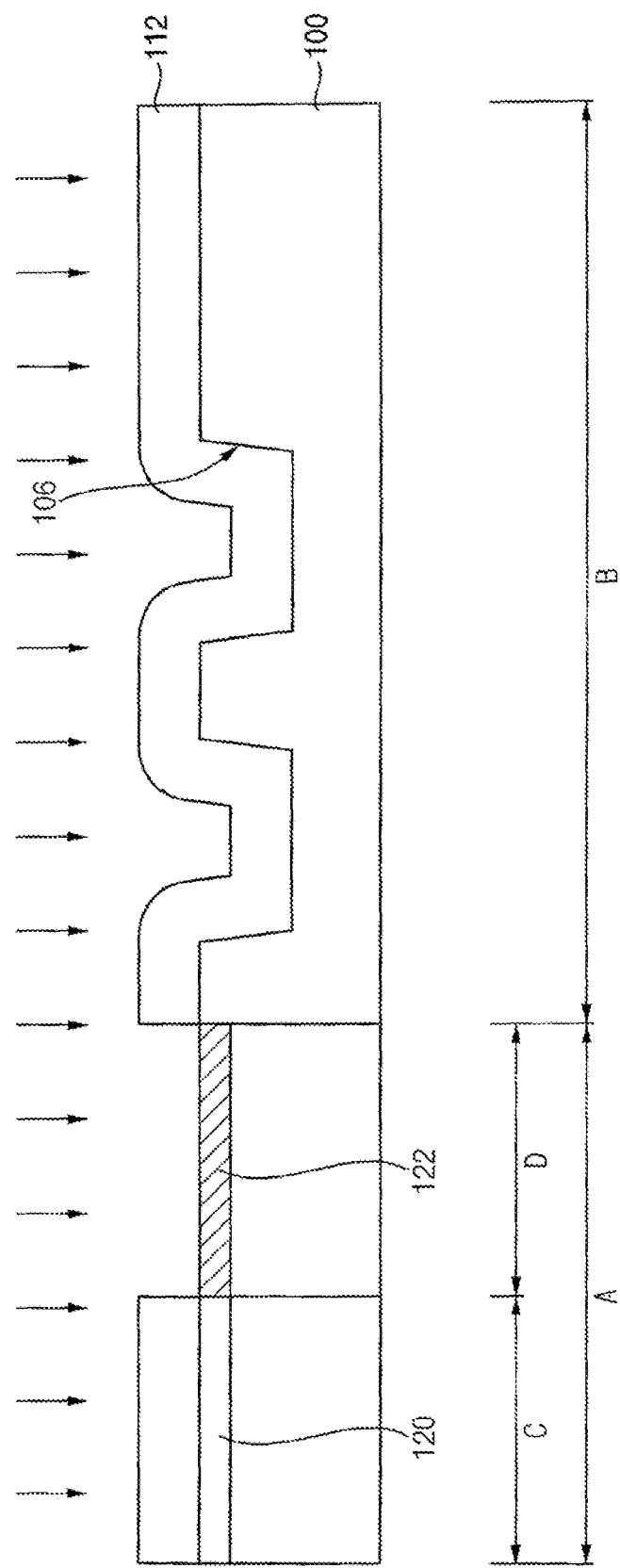

Referring to FIG. 8, a third photoresist layer may be coated on the substrate 100. With respect to the third photoresist layer, exposing and developing processes may be performed to form a third photoresist pattern 112 exposing the P-type multi-bridge channel transistor region of the main chip region A. The N-type multi-bridge channel transistor region C of the main chip region A and the scribe lane region B may be covered by the third photoresist pattern 112.

In the exposing process for forming the third photoresist pattern 112, a reticle may be aligned using the step difference between the bottom surface of the first trench 106 and the top surface of the substrate 100. Accordingly, a third photoresist pattern 112 may be formed at a target position.

Then, by using the third photoresist pattern 112 as an ion implantation mask, N-type impurities may be doped into the substrate 100. The N-type impurities may be doped in low concentration. Accordingly, an N-well region 122 may be formed on the upper part of the substrate 100 of the P-type multi-bridge channel transistor region D. In example embodiments, after injecting the N-type impurities, a heat treatment process for activating the N-type impurities may be further performed.

Figure 9:
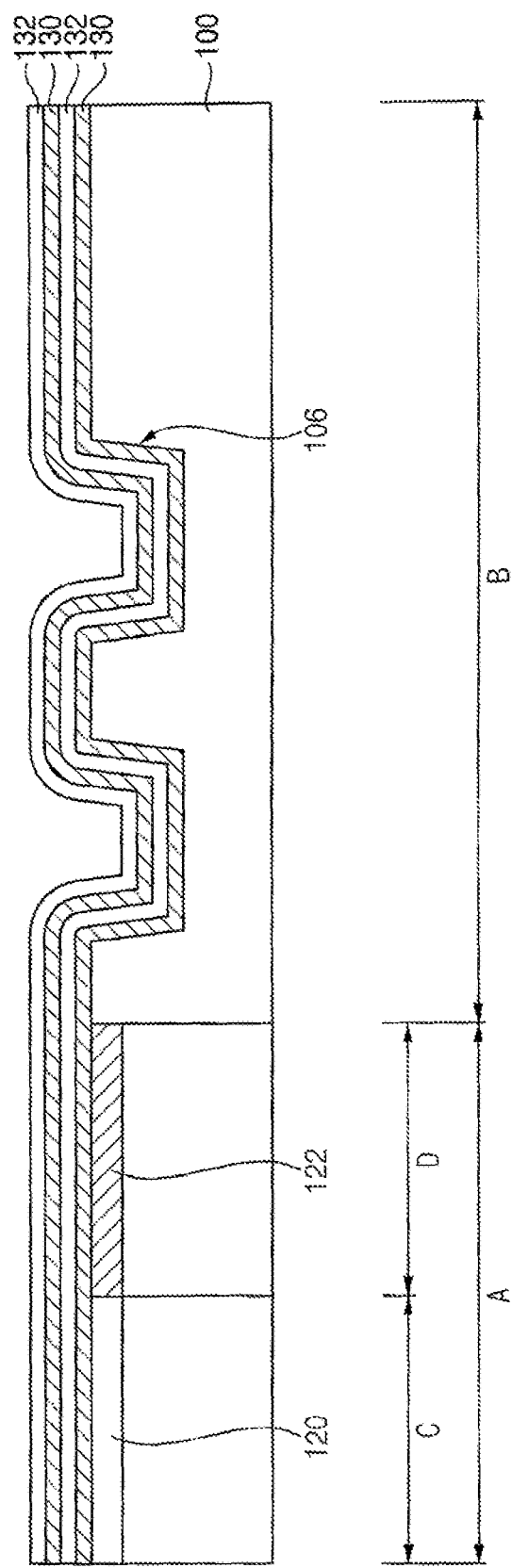

Referring to FIG. 9, on the substrate 100 of the main chip region A and the scribe lane region B, a first semiconductor material layer and a second semiconductor material layer, having a high etching selectivity to each other may be alternately and repeatedly stacked. The first semiconductor material layer may be a silicon germanium layer 130, and the second semiconductor material layer may be a silicon layer 132. Hereinafter, the explanation will be given considering that the silicon germanium layer 130 and the silicon layer 132 are alternately and repeatedly stacked.

Each of the silicon germanium layer 130 and the silicon layer 132 may be conformally formed along the surface profile of the top surface of the substrate 100 of the main chip region A and the surface of the first trenches 106 of the scribe lane region B. Accordingly, on the surface portion of the first trench 106, the silicon germanium layer 130 and the silicon layer 132 may be formed to have a top surface step as shown, e.g., in FIG. 9.

Similarly, the ion implantation process for forming the P-well region 120 and the N-well region 122 on the substrate 100 of the main chip region A may be performed before performing an alternate and repeated stacking process of the silicon germanium layer 130 and the silicon layer 132.

If the ion implantation process for forming the N-well region and the P-well region is performed after forming the silicon germanium layer and the silicon layer, the germanium of the silicon germanium layer may move (diffuse) to the silicon layer, and semiconductor material layers stacked may mix with each other. Accordingly, the distinction of the silicon germanium layer and the silicon layer may become difficult, and the formation of the silicon germanium layer and the silicon layer, having target compositions may be difficult. In this case, the selective removal of silicon germanium in the subsequent etching process may be difficult.

However, by performing the ion implantation process for forming the N-well region and the P-well region in the substrate 100 of the main chip region before forming the silicon germanium layer 130 and the silicon layer 132, the silicon germanium layer 130 and the silicon layer 132, having target compositions, may be formed.

The silicon germanium layer 130 and the silicon layer 132 may be formed through a selective epitaxial growth process using the upper portion of the substrate 100 as a seed.

In an embodiment, the silicon layer 132 may be formed by performing a selective epitaxial growth process using a silicon source gas such as a disilane (Si2H6) gas. The silicon layer 132 may include single crystal silicon.

In an embodiment, the silicon germanium layer 130 may be formed by performing a selective epitaxial growth process using a silicon source gas such as a dichlorosilane (SiH2Cl2) gas, and a germanium source gas such as a germanium tetrahydride (GeH4) gas. The silicon germanium layer 130 may include single crystal silicon germanium.

Figure 10:
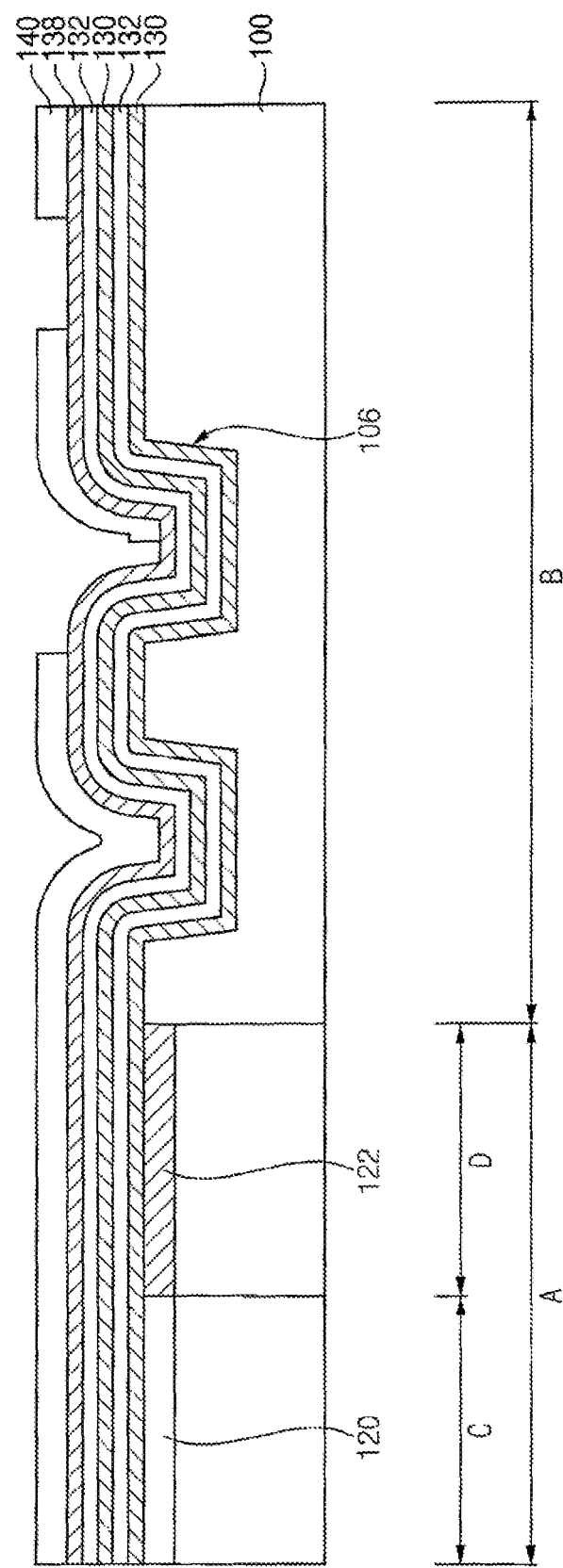
Figure 11:
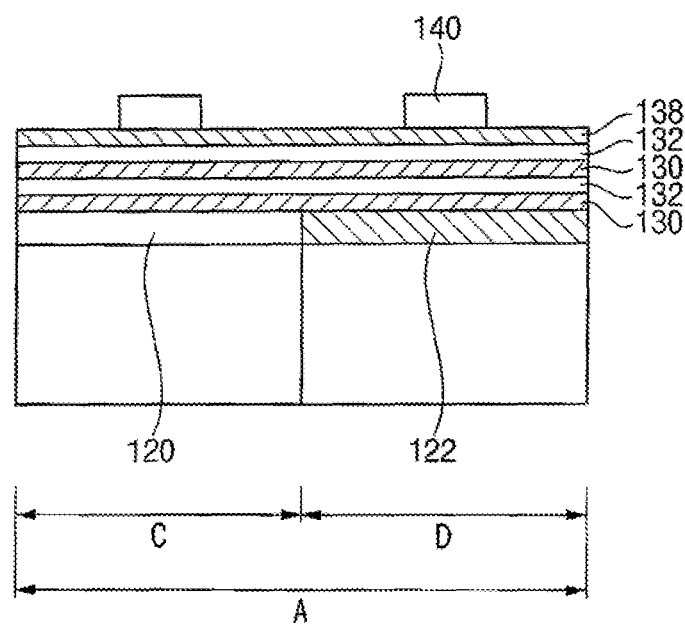
Figure 12:
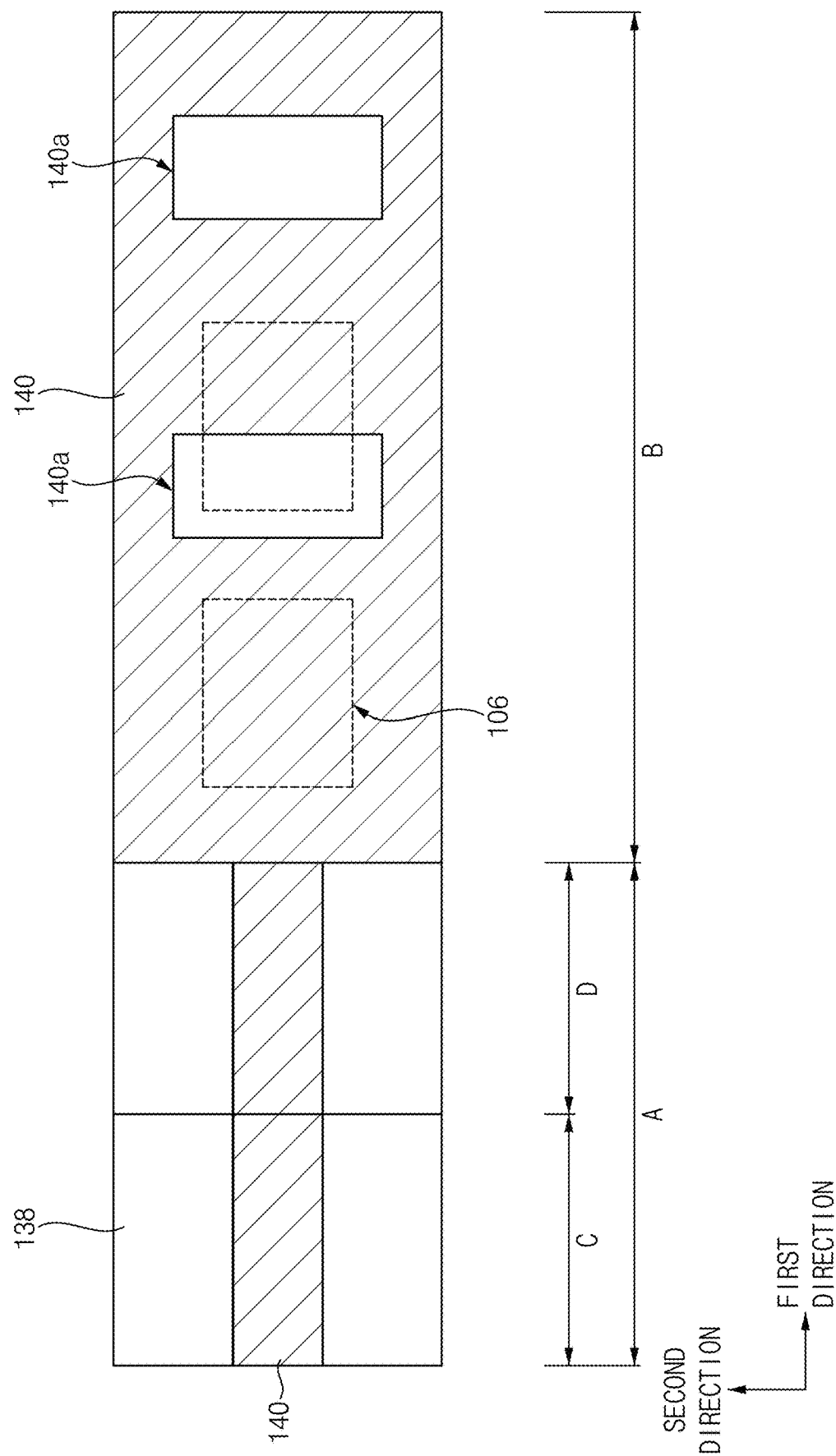

Referring to FIG. 10 to FIG. 12, a second hard mask layer 138 may be formed on the uppermost silicon layer 132. The second hard mask layer 138 may include, for example, a nitride such as silicon nitride.

On the second hard mask layer 138, a fourth photoresist layer may be formed. With respect to the fourth photoresist layer, exposing and developing processes may be performed to form a fourth photoresist pattern 140.

In the exposing process for forming the fourth photoresist pattern 140, a reticle may be aligned using a step difference formed by the first trenches 106.

The fourth photoresist pattern 140 may selectively cover a portion corresponding to an active region (that is, a region for forming an active structure) in the main chip region A. In addition, the fourth photoresist pattern 140 may selectively expose a portion for forming a second trench used as a second align key in the scribe lane region B.

In a partial region of the scribe lane region B, the exposed region 140a of the fourth photoresist pattern 140 may be non-overlapped with the first trench 106. The exposed region 140a (see, e.g., FIG. 12) of the fourth photoresist pattern 140 may be positioned at a portion where the first trench 106 is not formed. That is, the fourth photoresist pattern 140 may cover the stacked structure of the silicon germanium layer 130 and the silicon layer in the first trench 106.

In a partial region of the scribe lane region B, the exposed region 140a of the fourth photoresist pattern 140 may be overlapped with a portion of the first trench 106 and the top surface of the substrate 100 adjacent to the first trench 106. That is, the fourth photoresist pattern 140 may cover the stacked structure of the silicon germanium layer 130 and the silicon layer 132 formed on a portion in the first trench 106 and on the substrate adjacent to the first trench 106.

Figure 13:
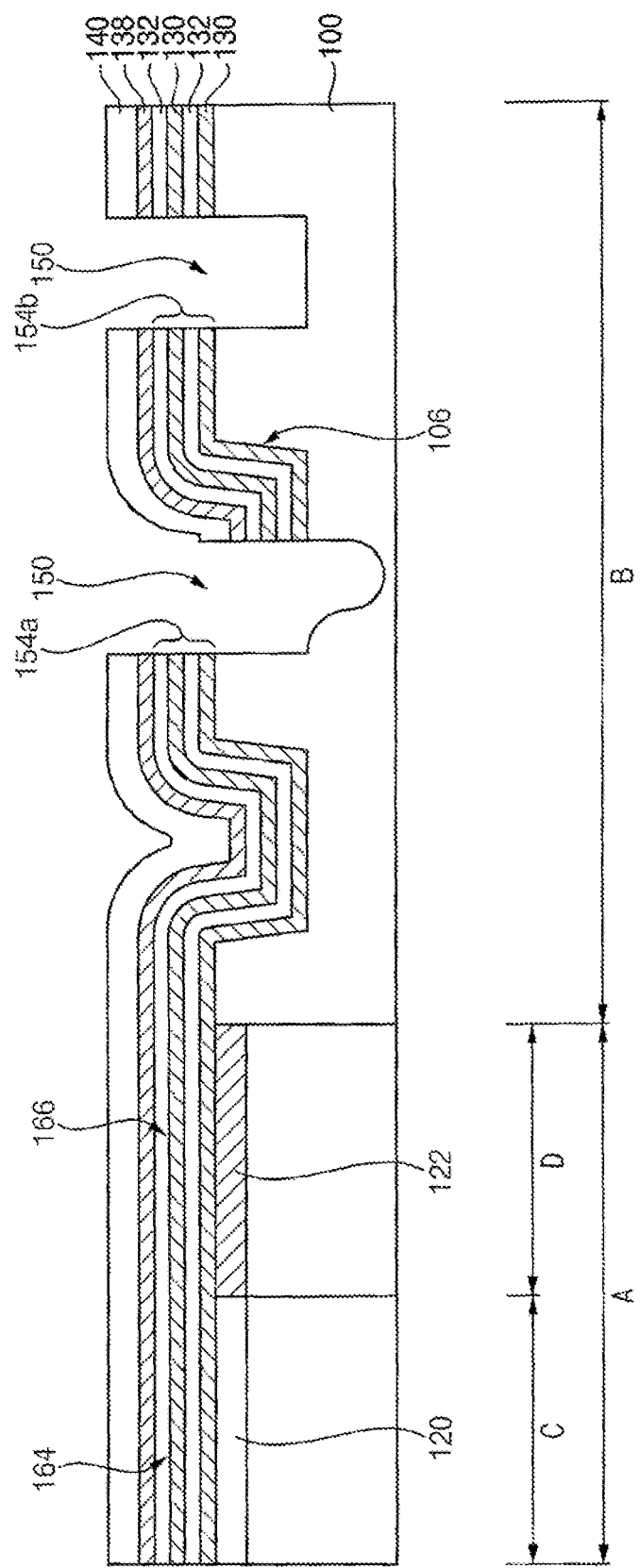
Figure 14:
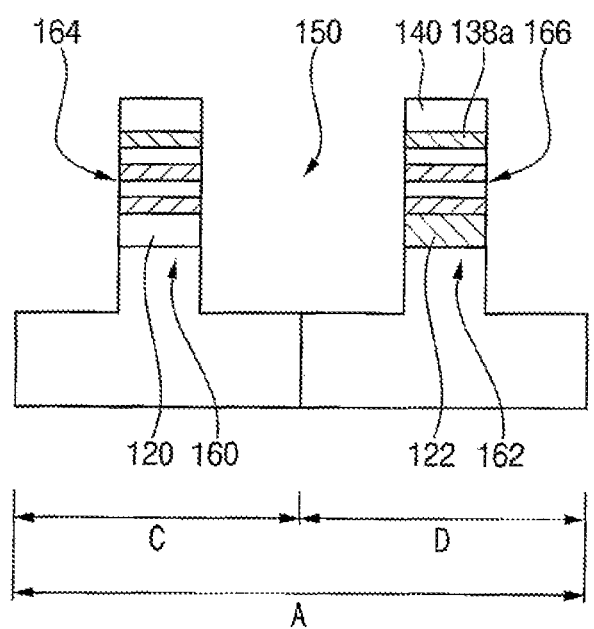

Referring to FIG. 13 and FIG. 14, the second hard mask layer 138 may be etched using the fourth photoresist pattern 140 as an etching mask to form a second hard mask pattern 138a.

In example embodiments, the second hard mask pattern 138a formed on the main chip region A may have a line shape extending in the first direction.

By etching the silicon germanium layer 130, the silicon layer 132 and the upper part of the substrate 100, using the second hard mask pattern 138a as an etching mask, second trenches 150 may be formed in the substrate. The etching process may include an anisotropic etching process.

Accordingly, in the substrate 100 of the N-type multi-bridge channel transistor region C in the main chip region A, the substrate 100 may be etched to form a first active pattern 160 extending in the first direction. On the first active pattern 160, a first pin structure 164 including alternately and repeatedly stacked silicon germanium patterns 130a and silicon patterns 132a may be formed. On the first active pattern 160, the first pin structure 164 and the second hard mask pattern 138a may be stacked.

In the substrate 100 of the P-type multi-bridge channel transistor region D in the main chip region A, the substrate 100 may be etched to form a second active pattern 162 extending in the first direction. On the second active pattern 162, a second pin structure 166 including alternately and repeatedly stacked silicon germanium patterns 130a and silicon patterns 132a may be formed. On the second active pattern 162, the second pin structure 166 and the second hard mask pattern 138a may be stacked.

In the scribe lane region B, the silicon germanium layers 130 and the silicon layers 132 exposed by the fourth photoresist pattern 140 may be etched to form a second trench 150.

By performing the forming process of the second trench 150, in the scribe lane region B, align key patterns 154a and 154b, having alternately and repeatedly stacked structure of silicon germanium patterns and silicon patterns may be formed on the inner surface of the first trenches 106 and on the top surface of the substrate 100 adjacent to the first trenches 106. According to the exposed region 140a of the fourth photoresist pattern 140 (see, e.g., FIG. 12), the position of the second trench 150 may be changed, and according to the position of the second trench 150, the align key patterns 154a and 154b may be formed into various shapes. The align key patterns 154a and 154b may be formed so as to contact at least a partial surface of the first trench 106.

In example embodiments, in a partial region in the scribe lane region B, a first align key pattern 154a continuously formed without cutting the stacked structure of the silicon germanium pattern 130a and the silicon pattern 132a on the surface of the first trenches 106 and on the top surface of the substrate between the first trenches 106, may be formed. The top surface of the first align key pattern 154a may be uneven and may have a step difference.

In example embodiments, in a partial region in the scribe lane region B, second align key patterns 154b having a partially cut shape of the stacked structure of the silicon germanium layer and the silicon layer, formed on the surface of the first trenches 106 and the top surface of the substrate 100 between the first trenches 106 may be formed. A space between the second align key patterns 154b may be the second trench 150, and the second trench 150 may be disposed at a position overlapped with a portion of the first trench 106 and a portion of the substrate 100 adjacent to the first trench 106. In this case, the second align key pattern 154b may have an alternately and repeatedly stacked shape of the silicon germanium pattern 130a and the silicon pattern 132a along a partial bottom surface and one side wall of the first trench 106 and the top surface of the substrate adjacent to the one side wall of the first trench 106. The top surface of the second align key pattern 154b may be uneven and may have a step difference. In the second trench 150, the bottom surface of a first portion overlapped with a portion of the first trench 106 may be lower than the bottom surface of a second portion overlapped with a portion of the substrate 100 that does not include the first trench 106.

In example embodiments, in a partial region in the scribe lane region B, third align key patterns 154c (FIG. 5) having a partially cut shape of the stacked structure of the silicon germanium layer and the silicon layer, formed on the surface of the first trenches 106 and the top surface of the substrate 100 between the first trenches 106 may be formed. Between the third align key patterns, the second trench 150 may be disposed. The second trench 150 may be disposed at a position overlapped with a portion of the first trench 106. In this case, the third align key pattern 154*c* may have an alternately and repeatedly stacked shape of the silicon germanium pattern 130*a* and the silicon pattern 132*a* along a partial surface of the first trenches 106 and the top surface of the substrate between the first trenches 106. The top surface of the third align key pattern may be uneven and may have a step difference. The bottom surface of the second trench 150 may be lower than the bottom surface of the first trench 106.

After that, the fourth photoresist pattern 140 may be removed.

Figure 15:
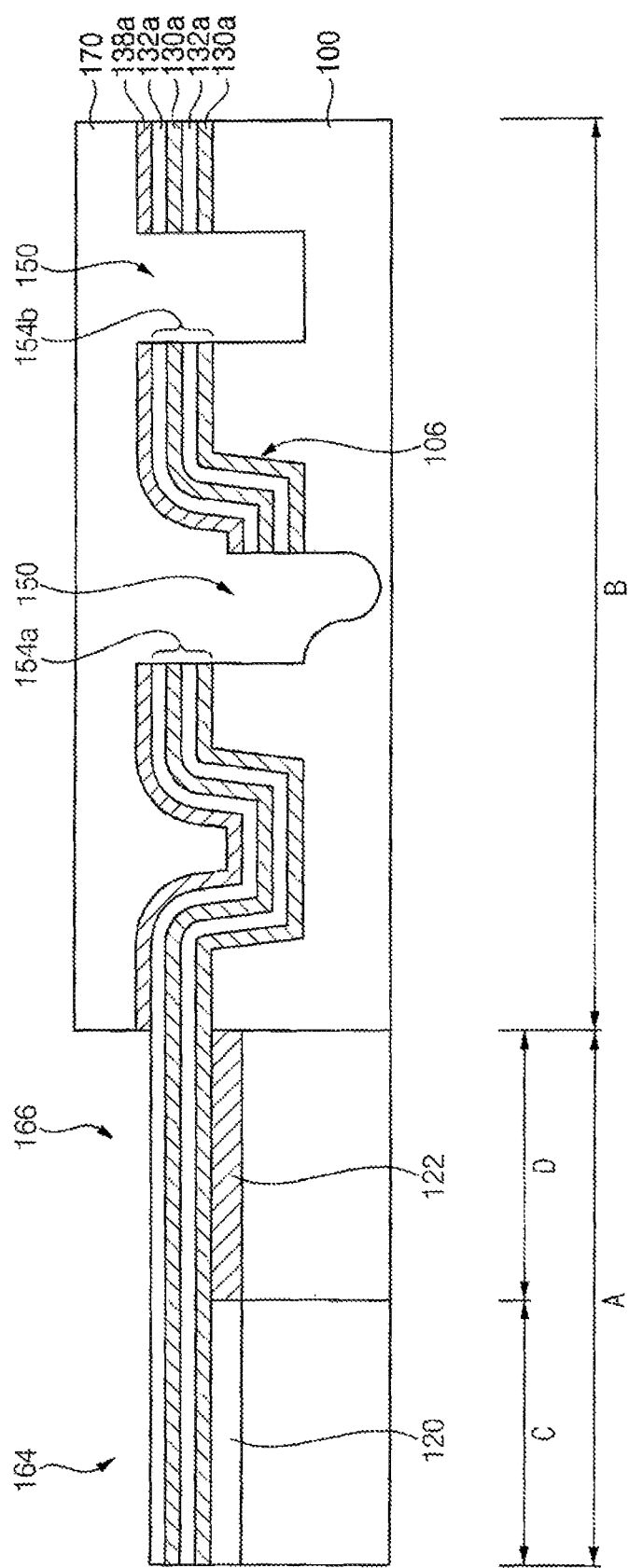
Figure 16:
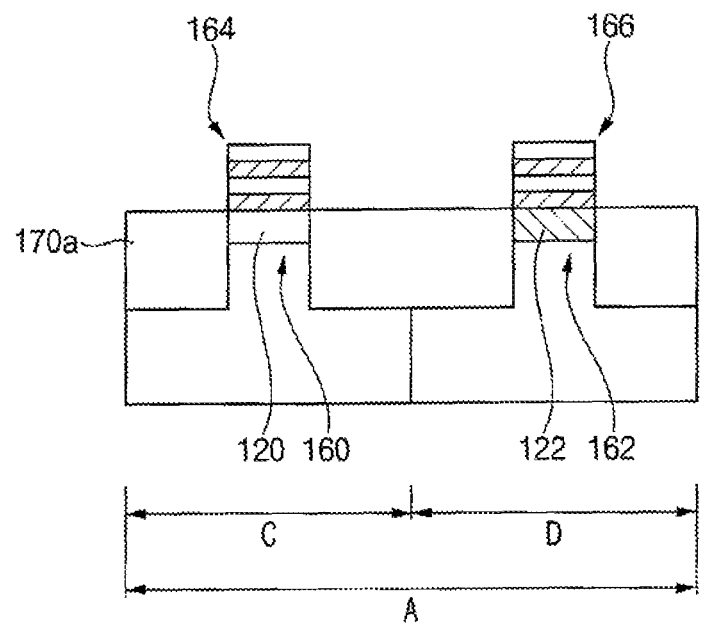

Referring to FIG. 15 and FIG. 16, a device isolation layer filling the second trench 150 at both sides of the first active pattern 160 and both sides of the second active pattern 162 may be formed on the substrate 100. The upper part of the device isolation layer may be partially etched to form a device isolation pattern 170*a* covering both sides of the first active pattern 160 and both sides of the second active pattern 162 (see, e.g., FIG. 16). Then, the second hard mask pattern 138*a* may be removed. The first pin structure 164 and the second pin structure 166 may be extruded up between the device isolation patterns 170*a*.

The substrate 100 of the scribe lane region B may be covered with the device isolation layer 170. On the align key patterns 154*a* and 154*b*, the second hard mask pattern 138*a* may remain.

Then, in the first pin structure 164, the N-type multi-bridge channel transistor may be formed, and in the second pin structure 166, the P-type multi-bridge channel transistor may be formed, respectively.

Hereinafter, an embodiment of a process for forming the N-type multi-bridge channel transistor and the P-type multi-bridge channel transistor will be explained in brief referring to FIG. 17 to FIG. 21, but the method of forming the N-type multi-bridge channel transistor and the P-type multi-bridge channel transistor may be not limited thereto. In addition, when the processes for forming the N-type multi-bridge channel transistor and the P-type multi-bridge channel transistor may be performed, the shapes of the align key patterns 154*a* and 154*b* formed in the scribe lane region may be unchanged. Accordingly, in FIG. 17 to FIG. 20, only the main chip region is shown.

Figure 17:
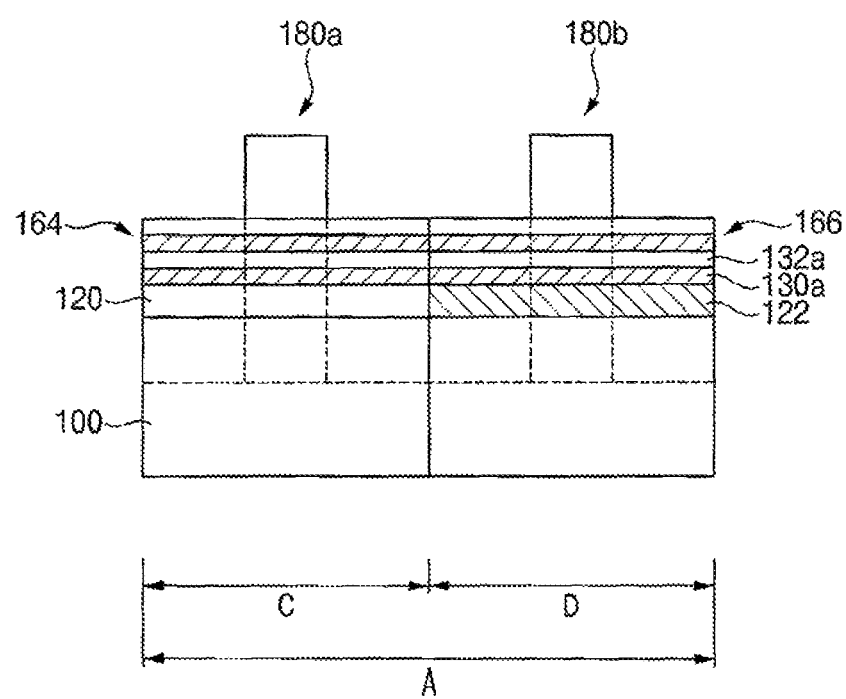

Referring to FIG. 17 and FIG. 18, a first dummy gate structure 180*a* partially covering the device isolation pattern 170*a* and the first pin structure 164, and a second dummy gate structure 180*b* partially covering the device isolation pattern 170*a* and the second pin structure 166 may be formed, respectively. The first and second dummy gate structures 180*a* and 180*b* may extend in the second direction. The first dummy gate structure 180*a* may cross the first pin structure 164, and the second dummy gate structure 180*b* may cross the second pin structure 166.

Each of the first and second dummy gate structures 180*a* and 180*b* may include a dummy gate dielectric layer pattern, a dummy gate electrode and a dummy gate mask pattern.

The portion where the first dummy gate structure 180*a* is formed may be provided as a portion for forming the first gate structure of the N-type multi-bridge channel transistor formed through the subsequent processes. The portion where the second dummy gate structure 180*b* is formed may be provided as a portion for forming the second gate structure of the P-type multi-bridge channel transistor formed through the subsequent processes.

In example embodiments, a process for forming a spacer on the side walls of the first and second dummy gate structures 180*a* and 180*b* may be further performed.

Referring to FIG. 19, the first pin structure 164 disposed on both sides of the first dummy gate structure 180*a* may be removed to form first openings 182.

A selective epitaxial growth process may be performed in the first openings 182 to form a first impurity region structure 190. In example embodiments, the first impurity region structure 190 may include silicon.

In example embodiments, during performing the selective epitaxial growth process, N-type impurities may be doped in-situ. Accordingly, the first impurity region structure 190 may be provided as the source/drain regions of an N-type multi-bridge channel transistor formed in subsequent processes.

The second pin structure 166 disposed on both sides of the second dummy gate structure 180*b* may be removed to form second openings 184.

A selective epitaxial growth process may be performed in the second openings 184 to form a second impurity region structure 192. In example embodiments, the second impurity region structure 192 may include silicon germanium.

In example embodiments, during performing the selective epitaxial growth process, P-type impurities may be doped in-situ. Accordingly, the second impurity region structure 192 may be provided as the source/drain regions of a P-type multi-bridge channel transistor formed in subsequent processes.

In example embodiments, after forming the second openings 184, a partial side wall of an exposed silicon germanium pattern 130*a* may be etched to form a recess, and a process for forming an inner spacer may be further performed in the recess.

Figure 20:
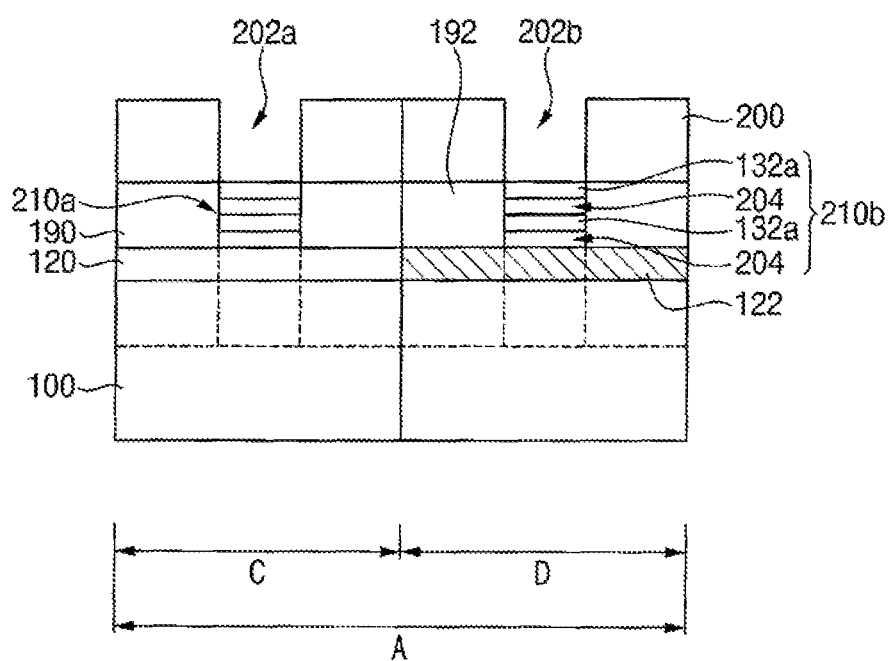

Referring to FIG. 20, an insulating interlayer 200 covering the first and second impurity region structures 190 and 192, the device isolation pattern and the first and second dummy gate structures 180*a* and 180*b* may be formed. Then, the insulating interlayer 200 may be planarized until the top surface of the first and second dummy gate structures 180*a* and 180*b* may be exposed.

By removing the first and second dummy gate structures 180*a* and 180*b*, first and second gate trenches 202*a* and 202*b* may be formed (see, e.g., FIG. 20). In the first and second gate trenches 202*a* and 202*b*, the silicon germanium pattern 130*a* and the silicon pattern 132*a* may be exposed.

Then, the silicon germanium pattern 130*a* exposed by the first and second gate trenches 202*a* and 202*b* may be selectively removed to form gaps 204 between the silicon patterns 132*a*.

In the first pin structure 164, the silicon patterns 132*a* disposed while being separated from each other in the vertical direction may be provided as the channel region of the N-type multi-bridge channel transistor. Accordingly, the first pin structure 164 may be formed into a first channel structure 210*a* by the etching process.

In the second pin structure 166, the silicon patterns 132*a* disposed while being separated from each other in the vertical direction may be provided as the channel region of the P-type multi-bridge channel transistor. Accordingly, the second pin structure 166 may be formed into a second channel structure 210*b* by the etching process.

As explained above, since an ion implantation process for forming a P-well region 120 and an N-well region 122 in the main chip region of the substrate 100 is performed prior to forming the silicon germanium layer and the silicon layer, a silicon germanium layer and a silicon layer, having target compositions may be formed. Accordingly, by the etching process, the silicon germanium pattern 130*a* may be selectively removed, and first and second channel structures 210*a* and 210b, having target structures may be formed. Accordingly, an N-type multi-bridge channel transistor and a P-type multi-bridge channel transistor, having target electrical properties may be formed through the subsequent processes.

Figure 21:
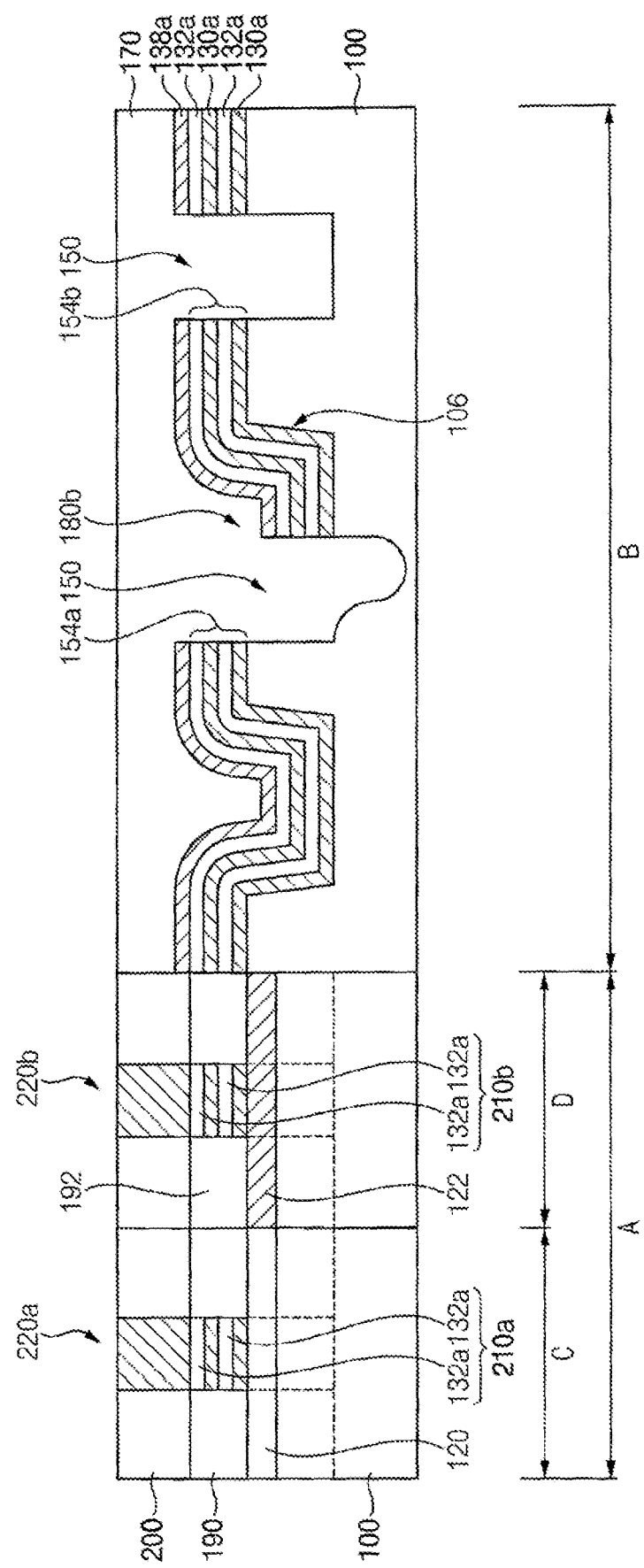

Referring to FIG. 21, a first gate structure 220a may be formed to fill the inside of the first gate trench 202a and the gaps 204. Accordingly, an N-type multi-bridge channel transistor may be formed.

In addition, a second gate structure 220b may be formed to fill the inside of the second gate trench 202b and the gaps 204. Accordingly, a P-type multi-bridge channel transistor may be formed.

The first gate structure 220a may include a first gate insulation pattern, a first gate electrode and a capping pattern. The second gate structure 220b may include a second gate insulation pattern, a second gate electrode and a capping pattern. The first and second gate electrodes may include a metal material.

Through the above-explained processes, the N-type multi-bridge channel transistor and the P-type multi-bridge channel transistor may be formed in the main chip region. In addition, align key patterns may be formed in the substrate of the scribe lane region. By forming the first and second align key patterns, a semiconductor device including multi-bridge channel transistors having target electrical properties may be formed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the disclosure. Accordingly, all such modifications are intended to be included within the scope of the disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate comprising a main chip region and a scribe lane region, wherein first trenches are formed in the scribe lane region;
   a well region doped with impurities on an upper part of the main chip region;
   align key patterns formed on surfaces of the first trenches and on surfaces of the substrate adjacent to the first trenches in the scribe lane region, wherein the align key patterns have an alternately and repeatedly stacked structure of a silicon germanium pattern and a silicon pattern; and
   a multi-bridge channel transistor on the main chip region, wherein at least one of the align key patterns comprises at least one second align key pattern in a partial region of the scribe lane region, and
   wherein the at least one second align key pattern has a shape in which the stacked structure of a silicon germanium layer and a silicon layer is partially cut.

2. The semiconductor device of claim 1, wherein each of the first trenches has a depth of about 20 nm or more from a top surface of the substrate.

3. The semiconductor device of claim 1, wherein an upper portion of a top surface of each of the align key patterns is higher than a lower portion of the top surface of each of the align key patterns.

4. The semiconductor device of claim 1, wherein the align key patterns comprise a first align key pattern in a partial region of the scribe lane region, and
   wherein the first align key pattern has a continuously formed shape of the silicon germanium pattern and the silicon pattern.

5. The semiconductor device of claim 1,
   wherein the second align key pattern is formed along a partial bottom surface and one side wall of at least one of the first trenches and on a portion of the substrate adjacent to the one side wall of the at least one first trench among the first trenches, and
   wherein a second trench is disposed between adjacent second align key patterns of the at least one second align key pattern.

6. The semiconductor device of claim 5, wherein a bottom surface of the second trench is uneven such that a lower portion of the bottom surface of the second trench is lower than an upper portion of the bottom surface of the second trench.

7. The semiconductor device of claim 5, wherein a bottom surface of the second trench comprises a first portion overlapped with a portion of the at least one first trench and a second portion overlapped with a portion of the substrate, and
   wherein the first portion has a greater depth than the second portion.

8. The semiconductor device of claim 1, wherein the at least one of the align key patterns comprises a at least one third align key pattern in a partial region of the scribe lane region,
   wherein the at least one third align key pattern is formed along a partial surface of adjacent ones of the first trenches and a top surface of the substrate between the first trenches, and
   wherein a second trench is disposed between adjacent third align key patterns of the at least one third align key pattern.

9. The semiconductor device of claim 1, wherein a hard mask pattern is formed on the align key patterns.

10. The semiconductor device of claim 1, wherein the well region comprises a P-well region doped with P-type impurities and an N-well region doped with N-type impurities according to a position of the substrate of the main chip region, an N-type multi-bridge channel transistor is formed on the substrate of the P-well region, and a P-type multi-bridge channel transistor is formed on the substrate of the N-well region.

11. The semiconductor device of claim 1, wherein the multi-bridge channel transistor comprises:
   a channel structure having a stacked structure of silicon patterns which are separated from each other in a vertical direction on the main chip region of the substrate;
   impurity region structures contacting both side walls of the channel structure and comprising an impurity-doped semiconductor material; and
   a gate structure filling a gap between the silicon patterns in the channel structure, the gate structure extending while surrounding the channel structure.

12. A semiconductor device, comprising:
a substrate comprising a main chip region and a scribe lane region, wherein first trenches are formed in the scribe lane region;
align key patterns formed on a surface of each of the first trenches and on a surface of the substrate adjacent to each of the first trenches in the scribe lane region, the align key patterns each having an alternately and repeatedly stacked structure of a silicon germanium pattern and a silicon pattern;
a P-well region doped with P-type impurities on an upper part of a first region of the substrate in the main chip region;
an N-well region doped with N-type impurities on an upper part of a second region of the substrate in the main chip region;
an N-type multi-bridge channel transistor formed on the P-well region and comprising a first channel of a first stacked structure of the silicon patterns which are separated from each other in a vertical direction; and
a P-type multi-bridge channel transistor formed on the N-well region and comprising a second channel of a second stacked structure of the silicon patterns which are separated from each other in the vertical direction,
wherein at least one of the align key patterns comprises at least one second align key pattern in a partial region of the scribe lane region, and
wherein the second align key pattern has a shape in which the stacked structure of a silicon germanium layer and a silicon layer is partially cut.

13. The semiconductor device of claim 12, wherein each of the first trenches has a depth of about 20 nm or more from a top surface of the substrate.

14. The semiconductor device of claim 12, wherein a first portion of a top surface of each of the align key patterns is higher than a second portion of the top surface of each of the align key patterns.

15. The semiconductor device of claim 12, wherein the align key patterns comprise a first align key pattern in a partial region of the scribe lane region, and
wherein the first align key pattern has a continuously formed shape of the silicon germanium pattern and the silicon pattern on the surface of the first trenches and on a top surface of the substrate between the first trenches.

16. The semiconductor device of claim 12,
wherein the at least one second align key pattern is formed along a partial bottom surface and one side wall of each of the first trenches and on a portion of the substrate adjacent to the one side wall of each of the first trenches, and
wherein a second trench is disposed between adjacent second align key patterns of the at least one second align key pattern.

17. A method of manufacturing a semiconductor device, the method comprising:
forming first trenches in a scribe lane region of a substrate;
forming an ion implantation mask on the substrate using the first trenches as an align key;
doping impurities into the substrate to form a well region on an upper part of a main chip region of the substrate;
alternately and repeatedly stacking a silicon germanium layer and a silicon layer on the main chip region of the substrate and the scribe lane region of the substrate; and
patterning the silicon germanium layer and the silicon layer to form a stacked structure of a silicon germanium pattern and a silicon pattern on the main chip region of the substrate and to form an align key pattern comprising the stacked structure of the silicon germanium pattern and the silicon pattern on the scribe lane region of the substrate,
wherein forming the align key patterns comprises forming a second align key pattern in a partial region of the scribe lane region, and
wherein the second align key pattern has a shape in which the stacked structure of the silicon germanium layer and the silicon layer is partially cut.

18. The method of manufacturing a semiconductor device of claim 17, wherein the align key pattern is formed to contact at least a partial surface of each of the first trenches.

* * * * *